United States Patent
Lin et al.

(10) Patent No.: US 7,845,957 B2
(45) Date of Patent: Dec. 7, 2010

(54) BURN-IN SOCKET HAVING ACTUATING MECHANISM STRENGTHENING CONTACT TO FACILITATE ELECTRICAL INTERCONNECTION

(75) Inventors: Chun-Fu Lin, Tu-Cheng (TW); Ke-Hao Chen, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/625,567

(22) Filed: Nov. 25, 2009

(65) Prior Publication Data

US 2010/0130032 A1    May 27, 2010

(30) Foreign Application Priority Data

Nov. 25, 2008   (TW) .............................. 97221045 U (51) Int. Cl.
*H01R 12/00*   (2006.01)
(52) U.S. Cl. .......................................... 439/73; 439/259
(58) Field of Classification Search ................. 439/70, 439/71, 73, 259, 264, 266, 330, 331, 342
See application file for complete search history.

(56) References Cited

U.S. PATENT DOCUMENTS

| | | | | |
|---|---|---|---|---|
| 5,611,705 | A * | 3/1997 | Pfaff | 439/266 |
| 6,768,653 | B2 * | 7/2004 | Ohashi | 361/807 |
| 6,866,531 | B2 * | 3/2005 | Hachuda | 439/331 |
| 6,948,945 | B2 * | 9/2005 | Chen et al. | 439/71 |
| 6,974,335 | B1 * | 12/2005 | Podpora | 439/71 |
| 7,210,951 | B2 * | 5/2007 | Sinclair | 439/259 |
| 7,214,084 | B2 * | 5/2007 | Hayakawa | 439/331 |
| 7,491,082 | B2 | 2/2009 | Hsu et al. | |
| 7,635,277 | B2 * | 12/2009 | Kanesashi | 439/331 |

* cited by examiner

*Primary Examiner*—Thanh-Tam T Le
(74) *Attorney, Agent, or Firm*—Andrew C. Cheng; Wei Te Chung; Ming Chieh Chang (57) ABSTRACT

An IC socket, adapted for electrically connecting an IC package and a printed circuit board, includes a base, a socket body received in the base, a plurality of contacts received in the socket body, and an actuating mechanism moveably assembled on the base. The socket body includes a first insulative housing and a second insulative housing located under the first insulative housing. The actuating mechanism can actuate the first insulative housing and a second insulative housing to move in a horizontal direction relative to each other and drive the contact to stretch in a vertical direction.

8 Claims, 9 Drawing Sheets

BURN-IN SOCKET HAVING ACTUATING MECHANISM STRENGTHENING CONTACT TO FACILITATE ELECTRICAL INTERCONNECTION

BACKGROUND OF THE INVENTION

1. Field of the Invention

The present invention generally relates to a burn-in socket, and particularly, to a burn-in IC (Integrated Circuit) socket having an actuating mechanism, which is able to drive a plurality of contacts of the burn-in socket to elongate along a vertical direction for electrically interconnecting with an IC package and a printed circuit board.

2. Description of the Related Art

U.S. Pat. No. 7,491,082 issued to Hsu on Feb. 17, 2009 discloses a conventional IC socket. The socket includes a base holding a plurality of contacts therein, a pair of latches pivotably attached to the base, and two pressing members mounted on the base and capable of moving vertically relative to the base. Each contact has two contacting portions extending beyond a top surface and a bottom surface of the base for contacting with an IC package and a printed circuit board. The pressing member comprises a pair of pressing tabs extending toward the base and engaging with the latch to actuate the latch to rotate relative to the base.

The pressing member of the conventional IC socket moves downwardly when an operating force is exerted on the pressing member, and the pressing tabs then press the pair of latches. The latches therefore rotate away from each other so as to open to an opened position to permit a loading and seating of the IC package into the socket for testing. The pressing members return to their initial positions when the operational force is released, and the latches resume back and press the IC package downwardly.

The contact has two contacting portions extending beyond a top surface and a bottom surface of the base respectively for contacting with the IC package and a printed circuit board. However, since the IC package is pre-loaded on the base, the contacts are possible to encounter a deformation or a damage when the IC package is not properly and correctly positioned on the socket or an operational force is abruptly surged to the IC package. Thus, the IC socket can not function properly.

BRIEF SUMMARY OF THE INVENTION

Accordingly, an object of the present invention is to provide an IC socket with a simplified configuration.

To fulfill the above object, an IC socket, adapted for electrically connecting with an IC package and a printed circuit board, comprises a base, a socket body assembled in the base, a plurality of contacts held in the socket body and an actuating mechanism assembled on the base. The socket body includes a first insulative housing and a second insulative housing, which are movable in a horizontal direction relative to each other. Each contact has a main portion, an upper resilient arm and a lower resilient arm extending obliquely respectively from opposite ends of the main portion. When the actuating mechanism actuates the insulative housings to move, the contact elongates in a vertical direction.

Other objects, advantages and novel features of the invention will become more apparent from the following detailed description of the present embodiment when taken in conjunction with the accompanying drawings.

DETAILED DESCRIPTION OF THE INVENTION

Reference will now be made in detail to the preferred embodiments of the present invention.

FIGS. 1-9 illustrate a preferred embodiment of an IC socket 100 in accordance with present invention. The IC socket 100, adapted for electrically connecting an IC package 8 and a printed circuit board 9, includes a base 1, a socket body 2 assembled in the base 1, a plurality of contacts 7 received in the socket body 2, an actuating mechanism 3 moveably assembled on the base 1.

Figure 1:
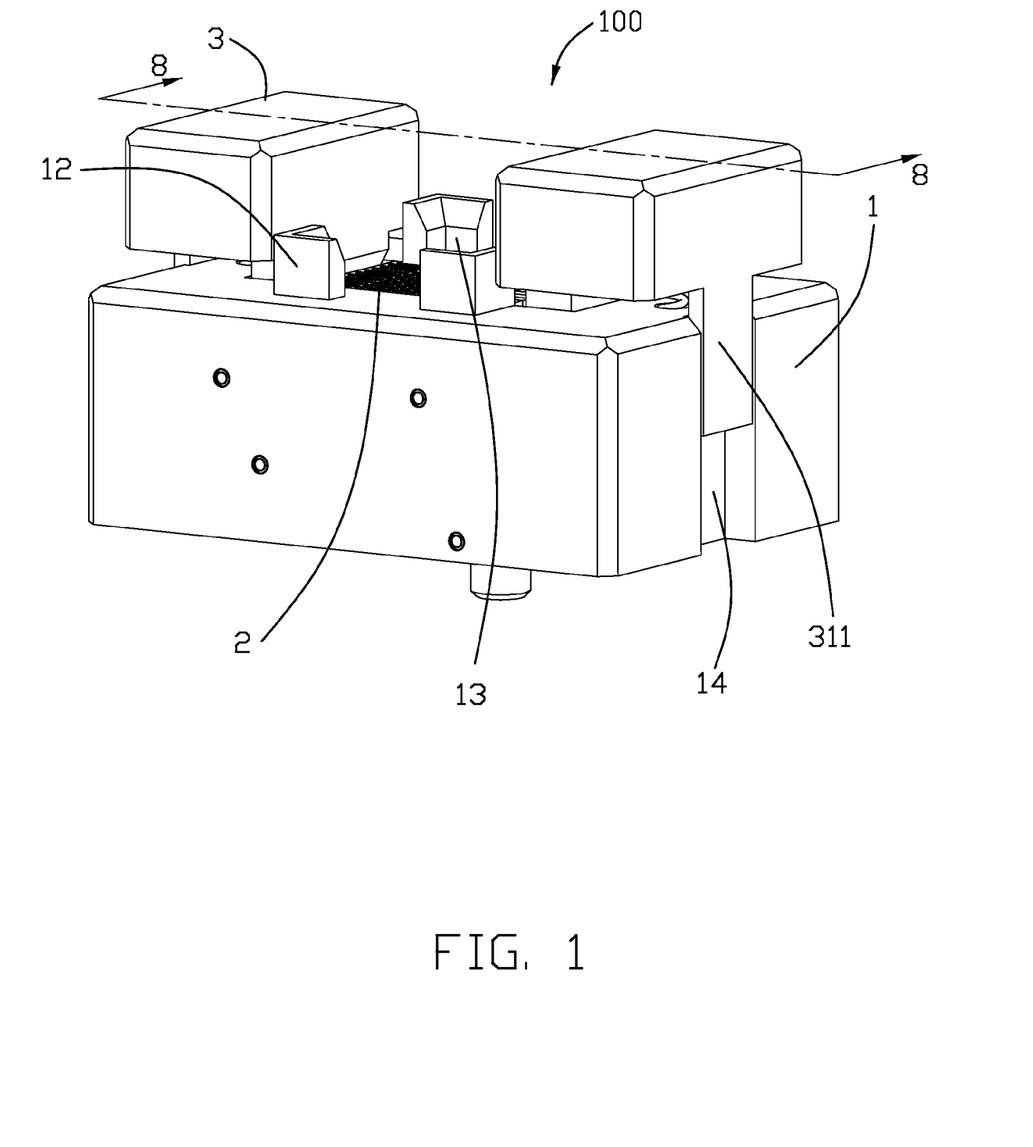
FIG. 1 is an assembled, perspective view of an IC socket according to a preferred embodiment of the present invention.
Figure 2:
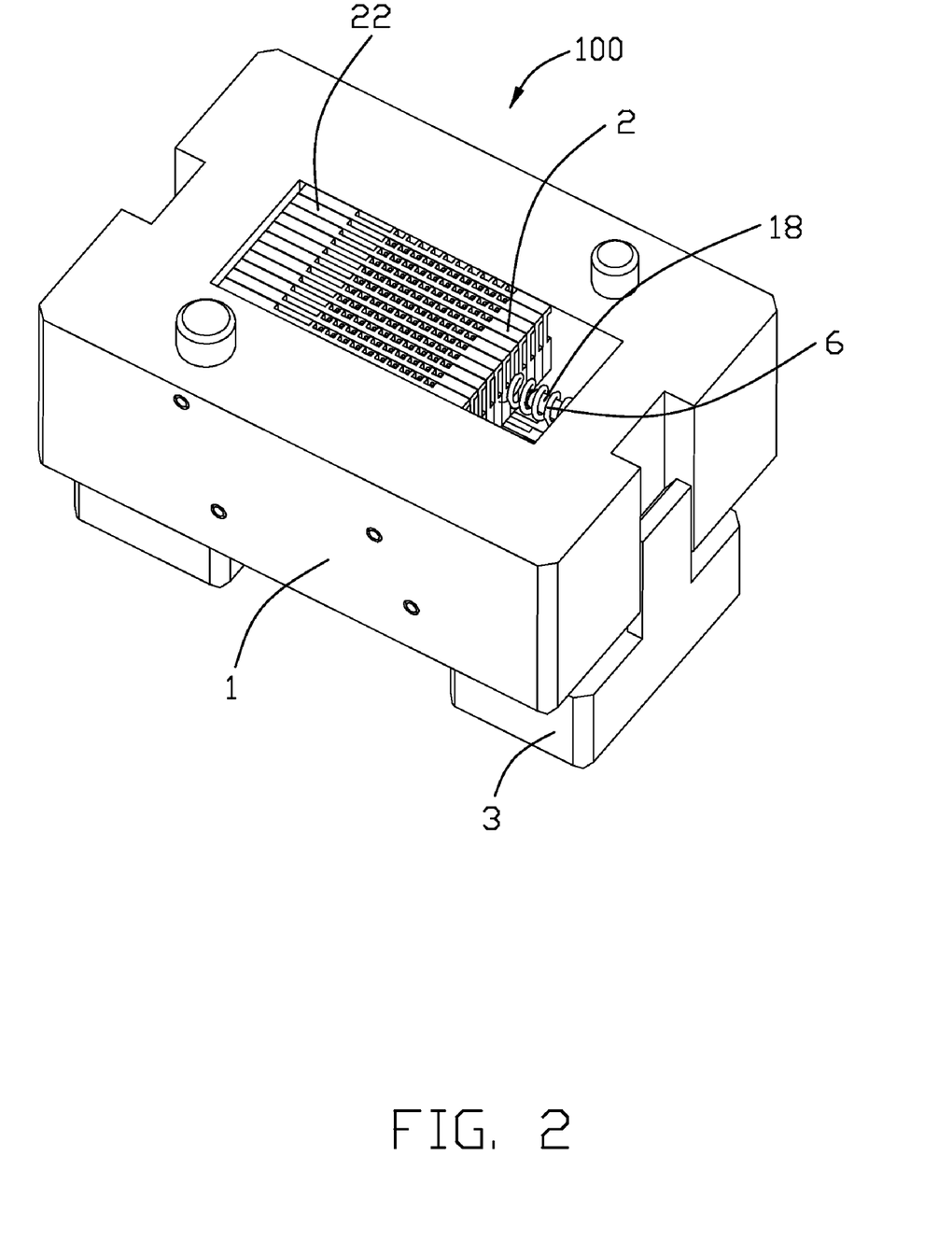
FIG. 2 is similar to FIG. 1, but taken from a bottom side.
Figure 3:
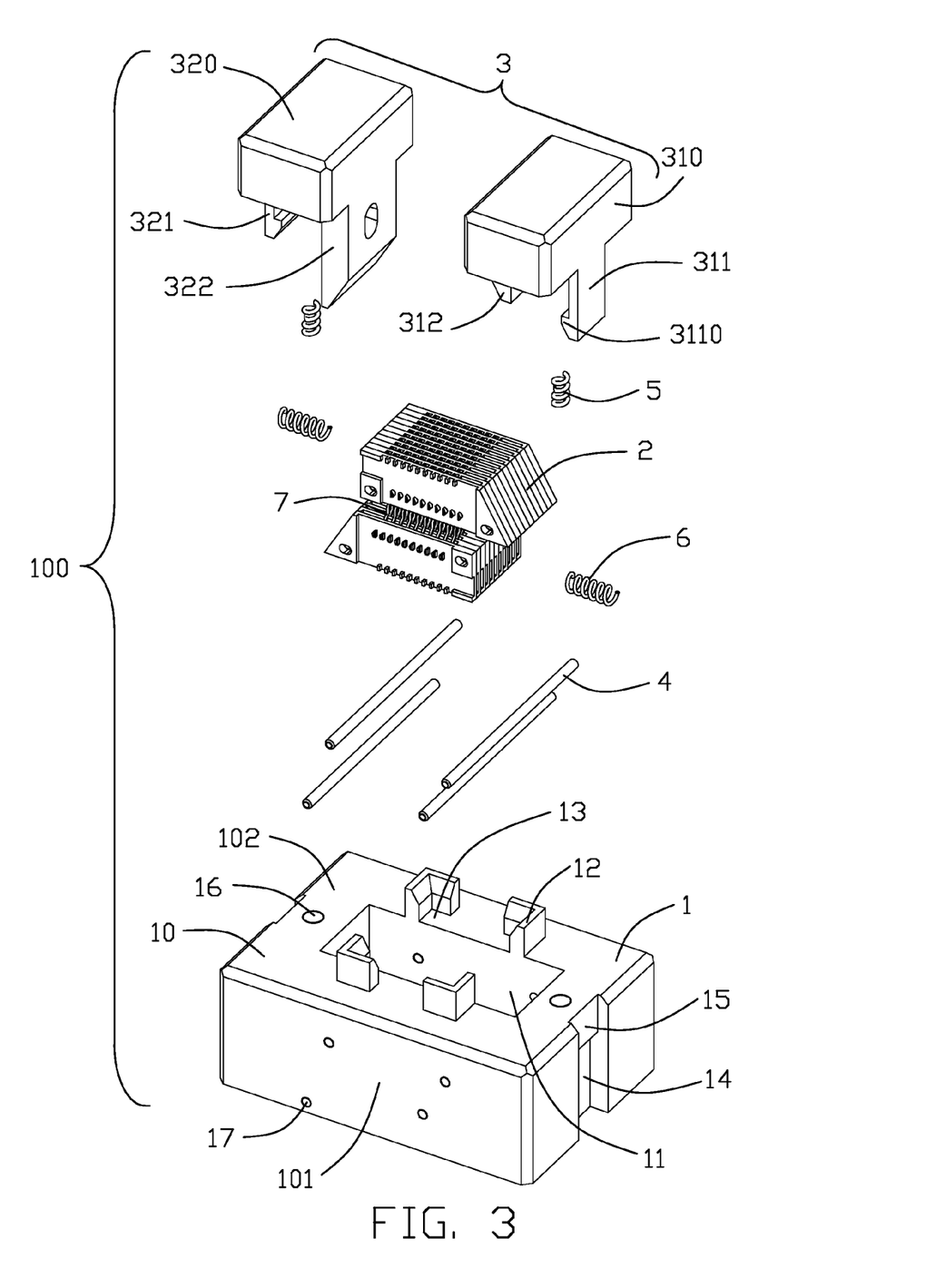
FIG. 3 is an exploded, perspective view of the IC socket according to the embodiment of the present invention.

Please referring to FIGS. 2-3, the base 1 has a main body 10 with a substantially rectangular configuration. The main body 10 includes a pair of transversal sidewalls 101 and two longitudinal sidewalls 102 connecting with the pair of transversal sidewalls 101. The main body 10 defines a chamber 11 in the center thereof for receiving the socket body 2. Four blocks 12 extend upwardly from a top surface of the main body 10 and around the chamber 11 to form a receiving room 13 for receiving the IC package 8. Four positioning holes 17 are defined on outer sidewalls of the pair of transversal sidewalls 101 of the base 1, and two pair of shafts 4 can insert through the positioning holes 17. A pair of guiding channels 14 are formed on a middle of outside surfaces of the longitudinal sidewalls 102, and used for guiding the actuating mechanism 3 to move upwardly and downwardly with respect to the base 1. Two protrusions 15 are respectively disposed on a top end of the guiding channels 14 for preventing the actuating mechanism 3 from moving out of the base 1. A pair of retaining holes 16 are defined on the two longitudinal sidewalls 102 and extend in the vertical direction for receiving first springs 5. A pair of positioning posts 18 (referring to FIG. 2) extend inwardly from inner surfaces of the two longitudinal sidewalls 102 for retaining a pair of second springs 6.

Figure 4:
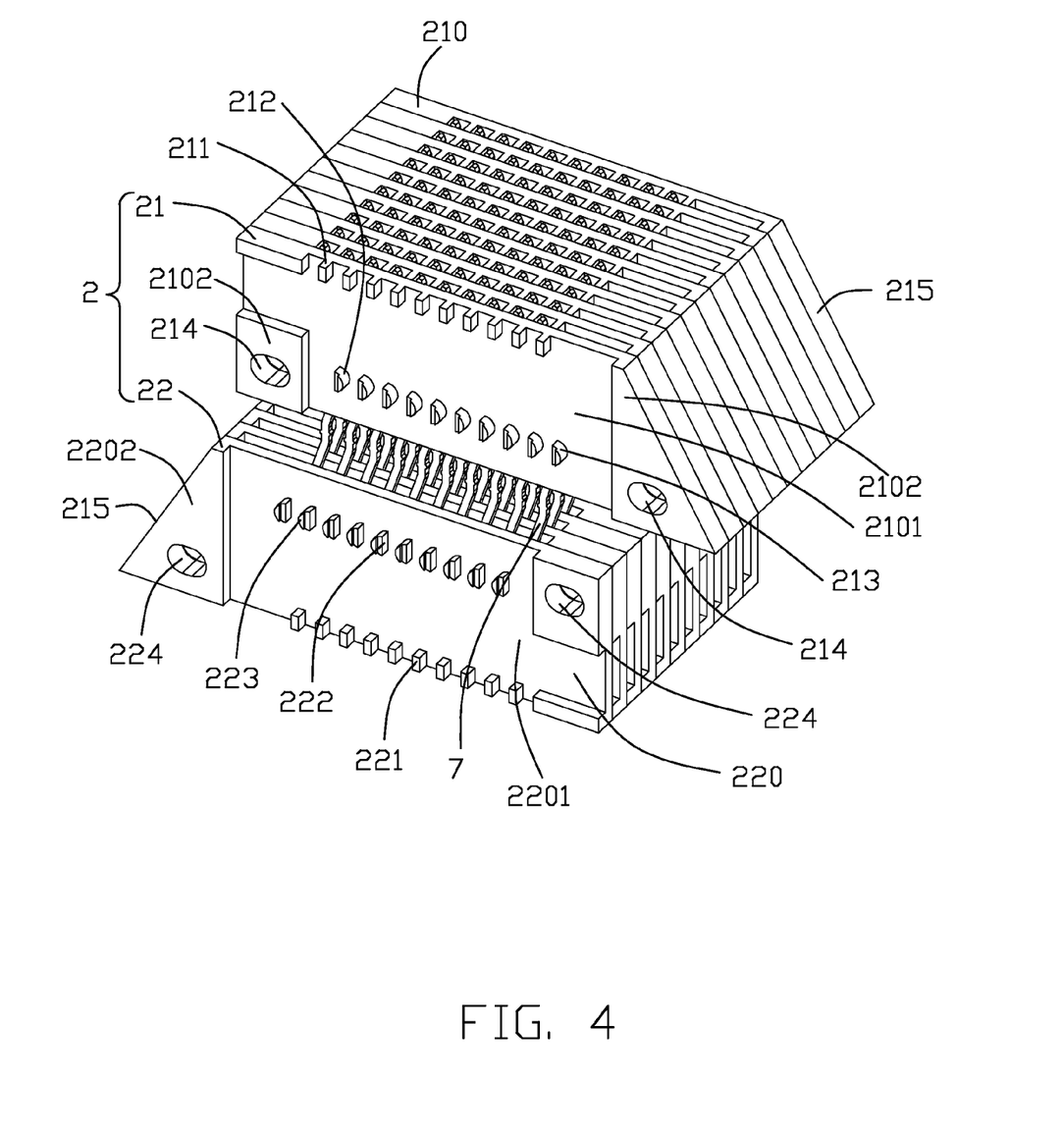
FIG. 4 is a perspective view of a socket body assembled with a plurality of contacts of the IC socket according to the embodiment of the present invention.
Figure 5:
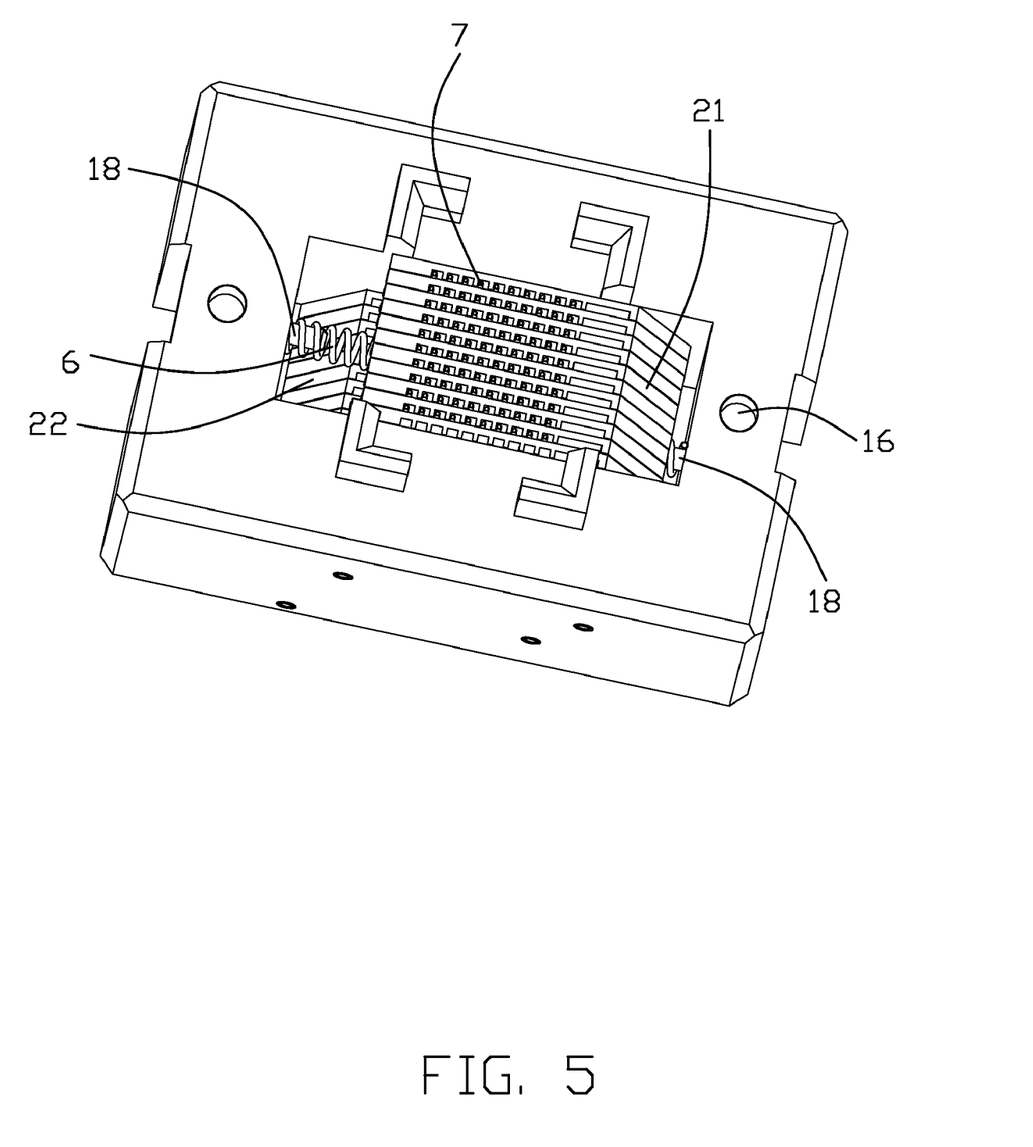
FIG. 5 is an partially assembled, perspective view of the IC socket according to a preferred embodiment of the present invention without an actuating mechanism.
Figure 6:
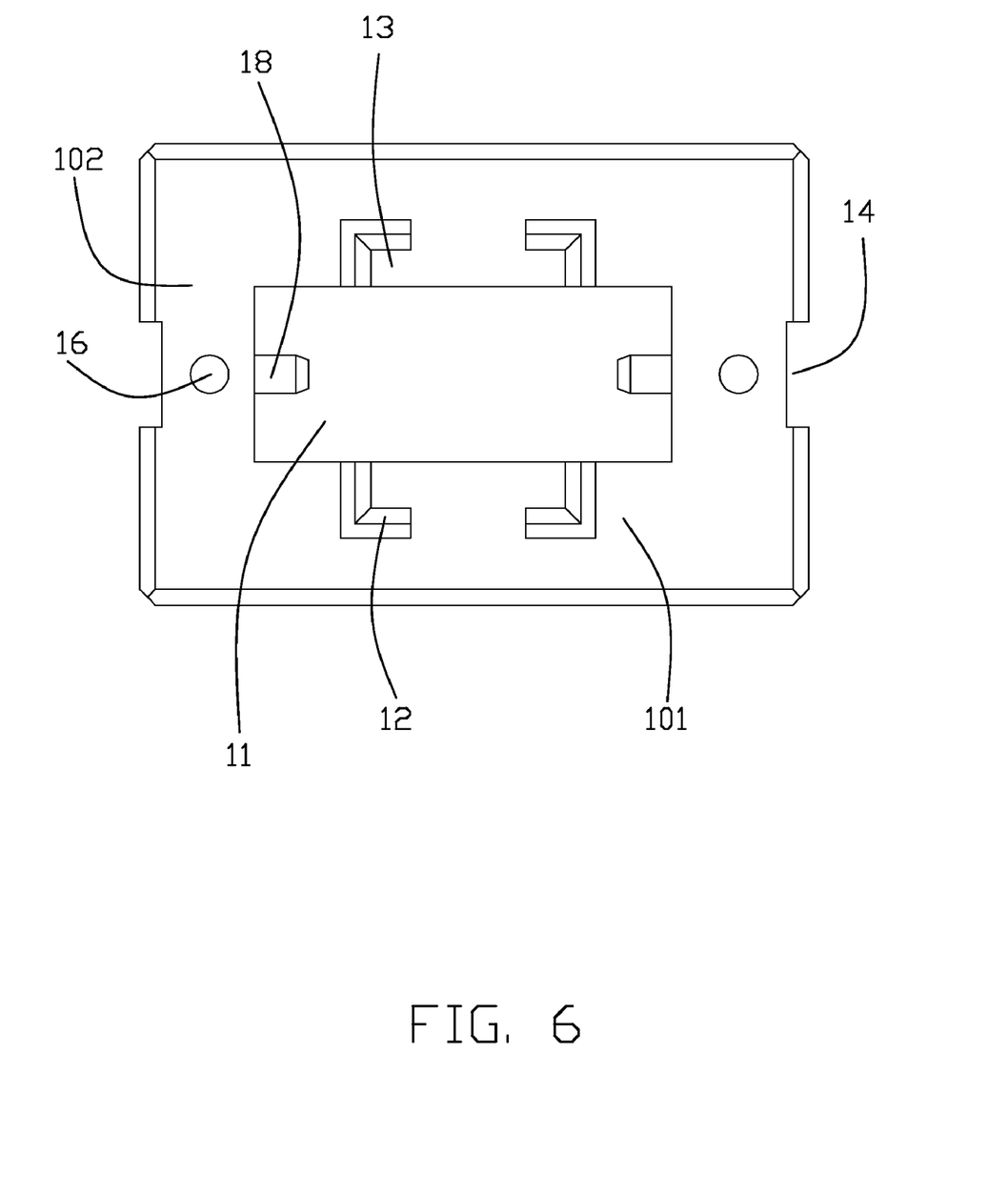
FIG. 6 is a perspective view of a base of the IC socket according to the embodiment of the present invention.

Referring to FIG. 4, the socket body 2 includes a first insulative housing 21 and a second insulative housing 22 disposed parallel to and under the first insulative housing 21. The first insulative housing 21 and the second insulative housing 22 are moveably associated on the base 1 by the pin shafts 4. The first insulative housing 21 includes a plurality of first insulative plates 210, each of the first insulative plate 21 is configured with a trapezoidal shape, and is firmly assembled with the other first insulative plates 210 side by side.

Each first insulative plate 210 includes a rectangular receiving portion 2101 on a lateral side surface and two resisting portions 2102 located beside two opposite ends of the receiving portion 2101. The receiving portion 210 is formed with a plurality of spaced first projections 211 on a top edge thereof and a plurality of spaced second projections 212 on a bottom edge thereof, correspondingly to the first projections 211. Each second projection 212 defines a semi-circular resisting surface 213 toward the resisting portion 2102. The first insulative plate 210 has two first through holes 214 defined on the resisting portions 2102 and disposed on two diagonal corners of the second insulative plate 210 for the shafts 4 passing through. And the first through hole 214 is configured with an elliptical shape which has a larger size in a horizontal direction, so that the first insulative housing 21 can move at the horizontal direction when it is driven by the actuating mechanism 3. One of the resisting portions has a triangular shape and a first oblique surface 215.

The second insulative housing 22 also has a plurality of second insulative plates 220 assembled side by side. The second insulative plate 220 has an identical structure with the first insulative plates 210, so the second insulative plate 220 includes a receiving portion 2201 and two resisting portions 2202 for engaging with the actuating mechanism 3. The receiving portion 2201 has a plurality of second projections 222 with a sem-circular resisting surface 223 and a plurality of first projections 221 corresponding to the second projections 222 for retaining the contacts 7. The resisting portions 2202 have a pair of elliptical second through holes 224, and one has a second oblique surface 225. The second insulative plate 220 and the first insulative plate 210 are arranged symmetrically with respect to a center, so the second oblique surface 225 of the second insulative housing 22 is opposite to the first oblique surface 215 of the first insulative housing 21. The shaft 4 inserts into the first through holes 214 and corresponding holes 17 to associate the first insulative housing 21 on the base 1, and pass through the second through holes 224 and corresponding holes 17 to associate the second insulative housing 22 on the base 1.

Figure 8:
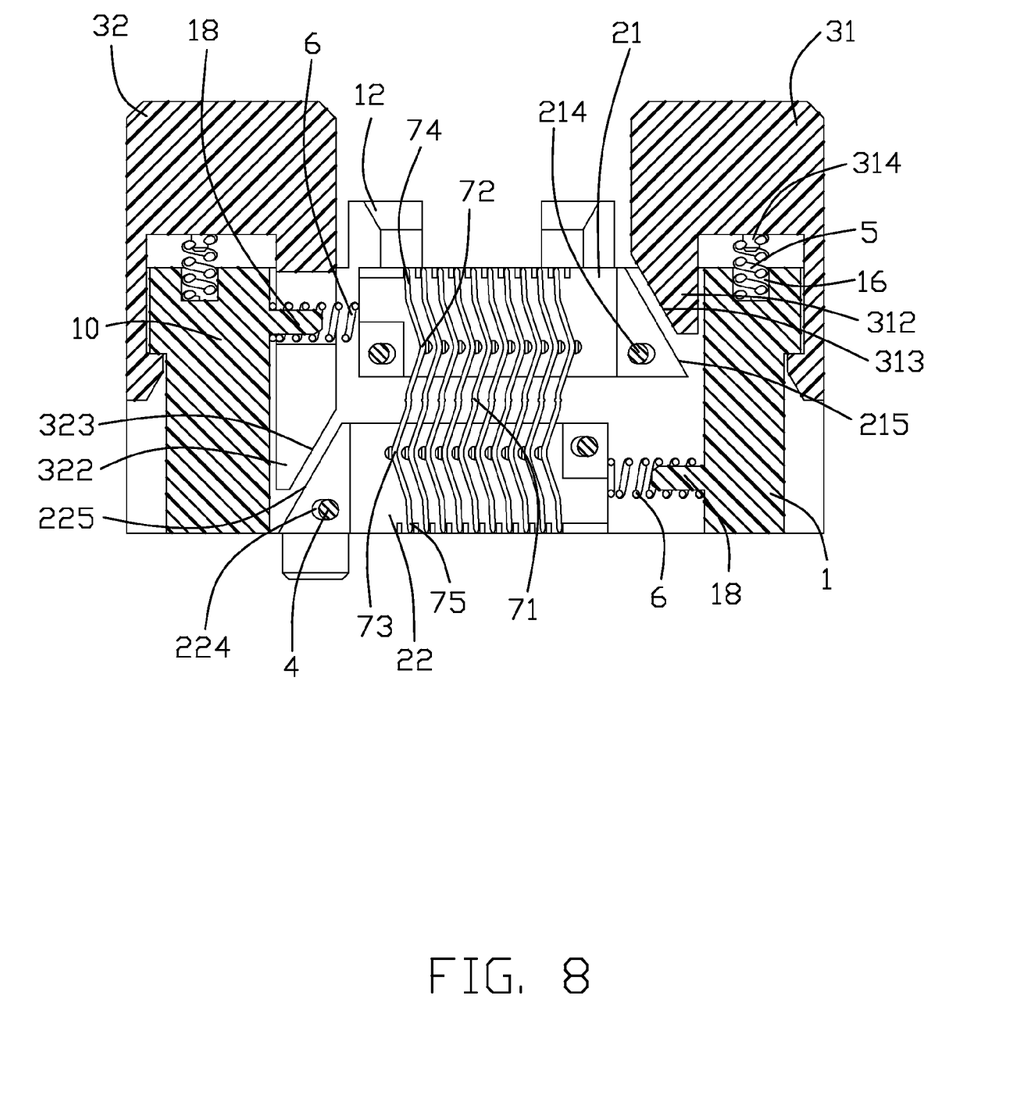
FIG. 8 is a cross section view of the IC socket taken along line 8-8 shown in FIG. 1, wherein the actuating mechanism is located at an initial position.
Figure 9:
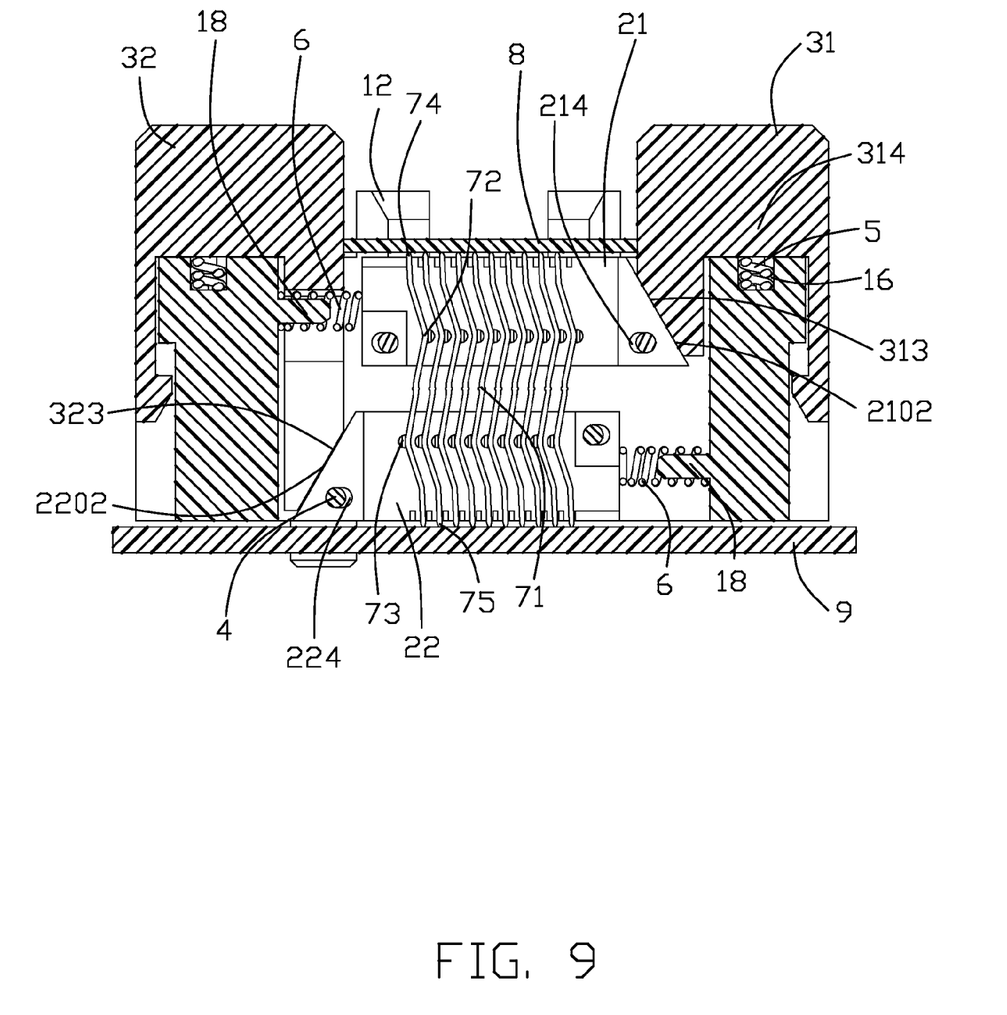
FIG. 9 is similar with FIG. 8, except that the actuating mechanism is located at a final position.

Best illustrated in FIG. 8 and FIG. 9, each contact 7 includes a deflectable main portion 71, an upper and lower resilient arms 72, 73 extending obliquely and respectively from opposite ends of the main portion 71 and away from each other. The upper and lower resilient arms 72, 73, each has a curved configuration so as to respectively resist on the second projections 212, 222 of the first insulative 21 and the second insulative housing 22. The upper resilient arm 72 is formed with an upper engaging portion 74 for electrically attaching to a corresponding conductive member formed on the IC package 8; the lower resilient arm 73 has a lower engaging portion 75 extending perpendicularly and downwardly from a distal end thereof for electrically connecting to the printed circuit board 9. The upper resilient arm 72 and the lower resilient arm 73 can elongate along the vertical direction when strengthened.

Figure 7:
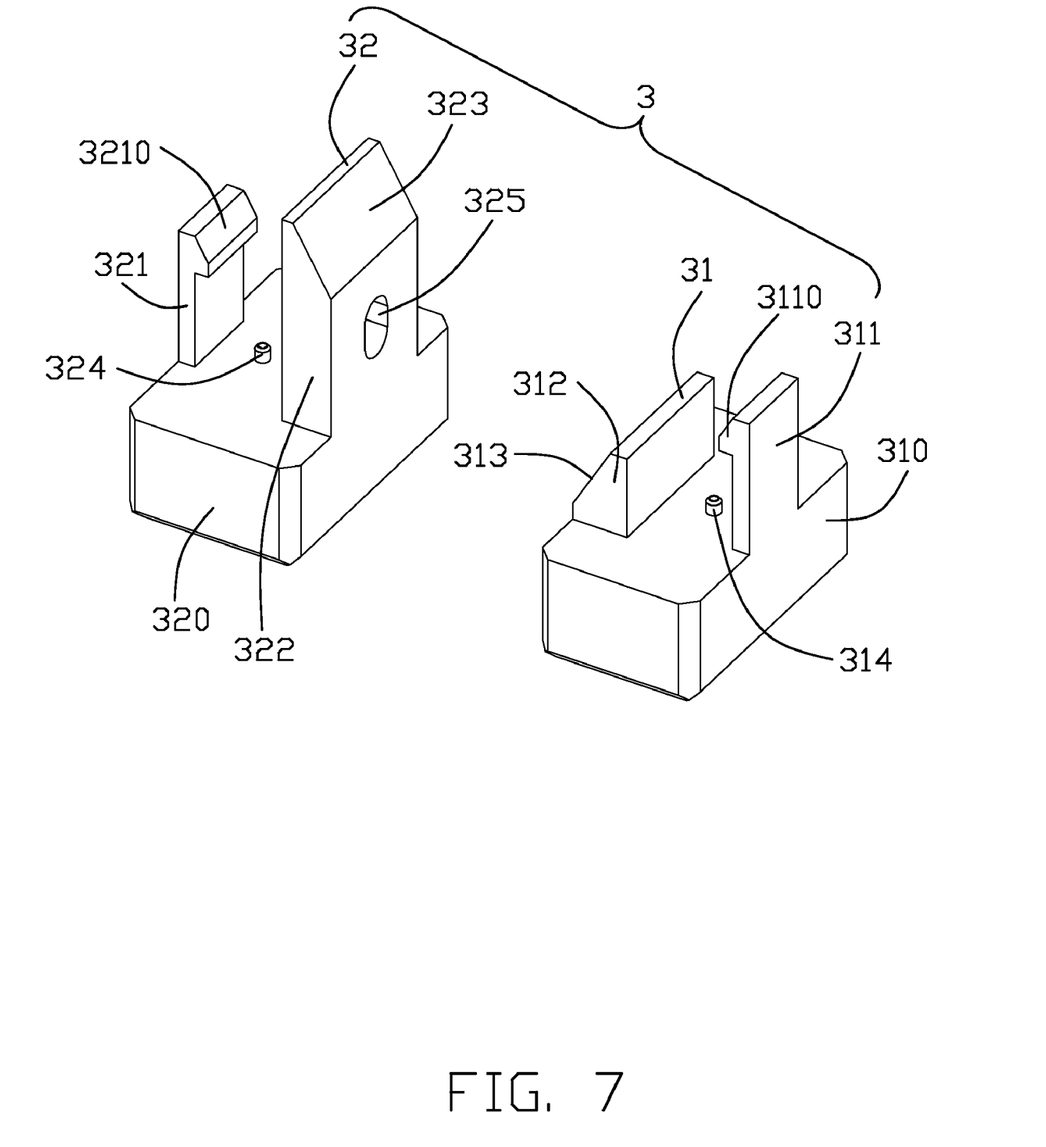
FIG. 7 is a perspective view of the actuating mechanism of the IC socket according to the embodiment of the present invention.

Referring to FIGS. 3 and 7, the actuating mechanism 3 includes a first driving member 31 for actuating the first insulative housing 21 and a second driving member 32 for actuating the second insulative housing 22. Both of the first driving member 31 and the second driving member 32 have a substantially rectangular supporting portion 310, 320. A first latch 311 with a hook 3110 extends downwardly from the supporting portion 310 for retaining the first driving member 31 on one side of the base 1. A second latch 321 with a hook 3210 extends downwardly from the supporting portions 320 for retaining the second driving member 32 on the other side of the base 1. The latches 311, 321 can move upwardly and downwardly in the guiding channels 14 of the base 1.

A first actuating portion 312 extends downwardly from an inner side of the supporting portion 310 to engage with the triangular first resisting portion 2102 of the first insulative housing 21. The first actuating portion 312 defines an inclined engaging surface 313. A second actuating portion 322 extends downwardly from an inner side of the supporting portion 320 to engage with the triangular resisting portion 2202 of the second insulative housing 22. The second actuating portion 322 also defines another inclined engaging surface 323. A post 314 is disposed between the first actuating portion 312 and the first latch 311 for retaining a first spring 5 on the first driving member 31. A post 324 is provided between the second actuating portion 322 and the second latch 321 for retaining another first spring 5 on the second driving member 32. An elliptical guiding hole 325 is defined on the second actuating portion 322 for the positioning post 18 with the second spring 6 passing through.

Referring to FIG. 1, FIG. 3, and FIGS. 8-9, when assembly, the contacts 7 are firstly assembled on the first and second insulative plates 211, 221, then arrange the insulative plates 211, 221 together to form the first and the second insulative housings 21, 22; the second springs 6 mounts on the posts 18 of the base 1, and then the first and the second insulative housing 21, 22 holding the contacts 7 are associated on the base 1 by the shafts 4; finally, the actuating mechanism 3 are assembled on the two longitudinal sidewalls 102 of the base 1, the hooks 3110, 3210 of the first and the second latches 311, 321 can slide into the guiding channels 14 and is limited by the protrusions 15 of the base 1.

Referring to FIGS. 8 and 9, when using, the IC package 8 is loaded into the receiving room 13 of the base 1, the actuating mechanism 3 is at an initial position, the upper engaging portion 74 and the lower engaging portion 75 of the contacts 7 are not exposed out of the socket body 2. When a downwardly external force acts on the actuating mechanism 3, the first and second latches 311, 312 of the actuating mechanism 3 move downwardly in the guiding channels 14 of the base 1. The inclined engaging surface 313 of the first driving member 31 abuts against the first oblique surfaces 215 of the first insulative housing 21 so as to push the first insulative housing 21 moving to the left along the horizontal direction. At a same time, the inclined engaging surface 323 of the second driving member 32 abuts against the second oblique surfaces 225 of the second insulative housing 22 so as to push the second insulative housing 22 moving to the right along the horizontal direction. Finally, the actuating mechanism 3 is reaches to a final position where the supporting portions 310, 320 of the first driving member 31 and the second driving member 32 both resist on the main body 10 of the base 1, then the IC package 8 is tested in such position.

During above process, when the first and the second insulative housings 21, 22 slide oppositely in the horizontal direction, the upper and lower resilient arms 72, 73 of the contacts 7 are brought to strengthen and elongate in the vertical direction, thus the upper engaging portion 74 and the lower engaging portion 75 of the contact 7 extend beyond the socket body 2 and can keep electrically contacting the IC package 8 and the printed circuit board 9 during a testing process. When the external force is withdrawn, the actuating apparatus 3 resumes to the initial position by restoration force of the first springs 5, the second springs 6 make the first and the second insulative housings 21, 22 return to their initial positions, and simultaneously, the contacts 7 collapse within the socket body 2 and the upper engaging portion 74 and the lower engaging portion 75 also return to initial positions.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An IC socket, adapted for electrically connecting with an IC package and a printed circuit board, comprising:
    a base;
    a socket body assembled in the base and including a first insulative housing and a second insulative housing, which are movable in a horizontal direction relative to each other;
    an actuating mechanism assembled on the base; and
    a plurality of contacts held in the socket body, each contact having a main portion, an upper resilient arm and a lower resilient arm extending obliquely respectively from opposite ends of the main portion, and the contact elongating along a vertical direction when the actuating mechanism actuates the insulative housings to move;
    wherein the upper resilient arm is positioned in the first insulative housing, and the lower resilient arm is located in the second insulative housing;
    wherein the first and the second insulative housings are received in a chamber defined in a center of the base by shafts passing holes defined on the base and elliptical through hole defined on the first and the second insulative housings;
    wherein the first insulative housing includes a plurality of first insulative plates arranged side by side, the second insulative housing includes a plurality of second insulative plates arranged side by side;
    wherein the first insulative plate and the second insulative plate have same configurations; and
    wherein the first insulative plate includes a rectangular receiving portion and two resisting portions located beside two opposite ends of the receiving portion, the receiving portion is formed with a plurality of spaced first projections on a top edge thereof and a plurality of spaced second projections on a bottom edge thereof to position the contact.

2. The IC socket according to claim 1, wherein one of the resisting portions has a triangular shape with an oblique surface.

3. The IC socket according to claim 2, wherein the actuating mechanism is mounted on the base and is movable in the vertical direction, the actuating mechanism has actuating portions abutting against the oblique surfaces and force the first and the second insulative housings to slide in the horizontal direction.

4. The IC socket according to claim 1, wherein the first insulative plate and the second insulative plate are arranged in a central symmetric manner, the second insulative housing is located under the first insulative housing.

5. The IC socket according to claim 1, wherein the upper resilient arm is formed with an upper engaging portion, the lower resilient arm has a lower engaging portion, both of the upper and the lower engaging portions are originally located within the socket body and extend beyond the socket body after the insulative housings move.

6. An IC socket, adapted for electrically connecting with an IC package and a printed circuit board, comprising:
    a socket body;
    a plurality of contacts held in the socket body, each contact has a main portion, an upper resilient arm and a lower resilient arm extending obliquely respectively from opposite ends of the main portion, the upper resilient arm formed with an upper engaging portion, the lower resilient arm having a lower engaging portion, both of the upper and the lower engaging portions being originally located within the socket body; and
    an actuating mechanism being movable relative to the socket body, the actuating mechanism moving downwardly and bringing the contact elongating along a vertical direction to make the upper resilient arm and the lower resilient arm extend out of the socket body;
    wherein the socket body is received in a base, and the actuating mechanism is movably assembled to the base;
    wherein the socket body includes a first insulative housing and a second insulative housing, which are forced by the actuating mechanism to move in a horizontal direction relative to each other;
    wherein the first and the second insulative housings are received in a chamber defined in a center of the base by shafts passing holes defined on the base and elliptical through hole defined on the first and the second insulative housings; and
    wherein the base is formed with a plurality of post, and a plurality of spring are assembled on the posts and abut against the first and the second insulative housings to force the first and the second insulative housings back after the actuating mechanism returns to an initial position.

7. An IC socket for use with an electronic package and a printed circuit board, comprising:
    an stationary base defining a chamber therein;
    an upper insulative housing back and forth moveable horizontally along a first directon;
    a lower insulative housing vertically located below and aligned with said upper insulative housing in a third direction perpendicular to said first direction, said lower insulative housing back and forth moveable horizontally along a second direction opposite to said first direction;
    a plurality of contacts each having middle section with above an upper half extending upwardly therefrom and deflected initially along said second direction and successive along the first direction, and with below a lower half extending downwardly therefrom and deflected initially along said first direction and successively along said second direction;
    the upper housing having upper and lower abutment devices, each pair of the upper and lower abutment devices respectively confronting an upper end and an upper deflected section of the upper half of each of the contacts; and
    the lower housing having upper and lower abutment structures, each pair of the upper and lower abutment structures respectively confronting a lower deflected section and a lower end of the lower half of each of the contacts;
    wherein the upper abutment device abuts against the upper end of the upper half of the contact in the first direction while the lower abutment device abuts against the upper deflected section in the second direction, the upper abutment structure abuts against the lower deflected section of the lower half of the contact in the second direction while the lower abutment structure abuts against the lower end of the lower half of the contact in the first direction;

wherein said contacts are essentially only retained by the upper and lower housing in position; and wherein said upper housing includes a plurality of wafers horizontally stacked with one another in a fourth direction perpendicular to all said first direction, said second direction and said third direction.

8. The IC socket as claimed in claim 7, wherein each of said contacts is essentially located between the corresponding two neighboring wafers in said fourth direction.

* * * * *